(12) United States Patent
Chi

(10) Patent No.: US 8,786,109 B2
(45) Date of Patent: Jul. 22, 2014

(54) CONDUCTIVE STRUCTURE AND METHOD FOR FORMING THE SAME

(71) Applicant: Chipmos Technologies Inc., Hsinchu (TW)

(72) Inventor: Chung-Pang Chi, Hsinchu (TW)

(73) Assignee: Chipmos Technologies Inc., Hsinchu (TW)

(*) Notice: Subject to any disclaimer, the term of this patent is extended or adjusted under 35 U.S.C. 154(b) by 0 days.

(21) Appl. No.: 13/793,241

(22) Filed: Mar. 11, 2013

(65) Prior Publication Data
US 2013/0292821 A1    Nov. 7, 2013

(30) Foreign Application Priority Data
May 7, 2012  (TW) ............................. 101116224 A

(51) Int. Cl.
*H01L 23/52*   (2006.01)
*H01L 23/498*  (2006.01)
*H01L 23/00*   (2006.01)
*H01L 21/768*  (2006.01)

(52) U.S. Cl.
CPC ........ *H01L 23/49811* (2013.01); *H04L 23/528* (2013.01); *H01L 24/11* (2013.01); *H01L 21/768* (2013.01)
USPC ........... 257/786; 257/778; 257/780; 257/737; 257/E23.023

(58) Field of Classification Search
CPC . H01L 24/14; H01L 23/528; H01L 23/49811; H01L 21/768; H01L 2224/0401; H01L 2224/0501; H01L 2224/3006; H01L 2224/3013; H01I 2224/05567
USPC ................................. 257/786, 737, 778, 780
See application file for complete search history.

(56) References Cited

U.S. PATENT DOCUMENTS

2006/0091535 A1* 5/2006 Tsao et al. ..................... 257/734
2010/0155937 A1* 6/2010 Hsu et al. ...................... 257/737

\* cited by examiner

*Primary Examiner* — Eva Y Montalvo
(74) *Attorney, Agent, or Firm* — Muncy, Geissler, Olds & Lowe, P.C.

(57) ABSTRACT

A conductive structure for a semiconductor chip and a method for forming the conductive structure are provided. The semiconductor chip comprises a plurality of first pads and second pads. The pad area is defined with a first area, a second area and a third area, wherein the first area is located between the second area and the third area. Each of the first pads and the second pads are interlaced to each other on the first area. The conductive structure comprises a plurality of conductive bumps formed on each of the first pads and the second pads respectively to electrically connect with each of the first pads and the second pads. Each of the conductive bumps has a first bump-width disposed on the first area and a second bump-width disposed on one of the second and third areas in which the first bump-width is shorter than the second bump-width.

11 Claims, 10 Drawing Sheets

CONDUCTIVE STRUCTURE AND METHOD FOR FORMING THE SAME

This application claims priority to Taiwan Patent Application No. 101116224 filed on May 7, 2012, the disclosures of which are incorporated herein by reference in their entirety.

CROSS-REFERENCES TO RELATED APPLICATIONS

Not applicable.

BACKGROUND OF THE INVENTION

1. Field of the Invention

The present invention provides a conductive structure and method for forming the conductive structure, and more particularly, to a conductive structure for a semiconductor chip and a method for forming the conductive structure.

2. Descriptions of the Related Art

Flip-chip packaging technology is mainly used to flip the front surface of a chip over and then join the bumps of the chip with the pads of a substrate so that the bumps are used as electrical conduction paths between the chip and the substrate. Because the bumps can be uniformly distributed on the whole chip with fine spacing between the bumps, this can effectively reduce the packaging volume and increase the circuit density. Therefore, flip-chip packaging technology has been widely used in microprocessor packages, graphic chips, computer chips, etc.

FIGS. 1A to 1C are schematic top views illustrating a semiconductor structure 1 and process of forming the semiconductor structure 1 of the prior art. FIGS. 1A' to 1C' are schematic side views corresponding to FIGS. 1A to 1C respectively.

First, with referring to both FIGS. 1A and 1A', the semiconductor structure 1 consists of a substrate 11, a plurality of pads 12, a passivation layer 13 and an under bump metal layer 14. After the conventional pads 12 are arranged on the substrate 11 equidistantly and adjacent to each other, an insulation layer 15 is disposed to cover the under bump metal layer 14, and then a plurality of rectangular openings 151 are formed in the insulation layer 15 to allow bumps 16 to be respectively implanted therein. As shown in FIGS. 1B and 1B', after the bumps 16 are disposed in the openings 151, excess portions of the insulation layer 15 can be removed to expose the under bump metal layer 14.

Finally, as shown in FIG. 1C and FIG. 1C', the under bump metal layer 14 except for portions thereof that are located beneath the bumps 16 are removed through an etching process to expose the passivation layer 13 to prevent electrical conduction between chip components in the substrate 11 and external components through the under bump metal layer 14.

As shown in FIGS. 1B and 1B', a spacing distance 161 exists between the bumps 16. The projection areas formed by two adjacent and alternately arranged bumps 16 which are projected onto each other have an overlapping area A1. In the aforesaid etching process, because the spacing distance 161 between the conventional bumps 16 is too small and each of the overlapping areas A1 are elongated, the etchant cannot effectively permeate into spacing distance 161. However, the area A2 around the bumps 16 is relatively wide. Consequently, the reaction rate of the etchant in the wide area A2 is higher than the reaction rate of the etchant in the overlapping areas A1. Due to the uneven etching of the under bump metal layer 14 among the overlapping areas A1, a part of the under bump metal layer 14 will remain on the substrate and, moreover, excessive etching might also cause deformation of the bumps 16 to affect the quality of the overall semiconductor structure 1.

Accordingly, it is important to provide a conductive structure for a semiconductor chip capable of overcoming the aforesaid shortcomings.

SUMMARY OF THE INVENTION

An objective of the present invention is to provide a conductive structure for a semiconductor chip to minimize an uneven etching of the conventional under bump metal layer by the etchant, and consequently, prevent bump deformation.

To achieve the aforesaid objective, the semiconductor chip of the present invention comprises a semiconductor substrate, a plurality of first pads, a plurality of second pads, a passivation layer and a plurality of under bump metal layers. Each of the first pads and each of the second pads are alternately arranged on a pad area of the semiconductor substrate. The pad area defines a first area, a second area and a third area. The first area is located between the second area and third area. Each of the first pads and each of the second pads are interlaced with each other on the first area. The first area extends towards the second area and the third area respectively. The passivation layer formed on the semiconductor substrate has a plurality of first openings to partially expose each of the first pads and each of the second pads. Each of the under bump metal layers is formed on the passivation layer and is electrically connected with each of the first pads and each of the second pads through each of the first openings formed in the passivation layer. The conductive structure comprises a plurality of conductive bumps, which are formed on each of the first pads and each of the second pads respectively. Each of the under bump metal layers is disposed under each of the conductive bumps so that each of the conductive bumps is electrically connected with each of the first pads and each of the second pads through each of the under bump metal layers. Each of the conductive bumps has a first bump-width in the first area and a second bump-width in the second area and third area. The first bump-width is smaller than the second bump-width.

Another objective of the present invention is to provide a method for forming a conductive structure of a semiconductor chip. To achieve this objective, the semiconductor chip comprises a semiconductor substrate, a plurality of first pads, a plurality of second pads, a passivation layer and an under bump metal layer. Each of the first pads and each of the second pads are alternately arranged on a pad area of the semiconductor substrate. The pad area defines a first area, a second area and a third area. The first area is located between the second area and third area. Each of the first pads and each of the second pads are interlaced with each other on the first area. The first area extends towards the second area and third area respectively. The passivation layer formed on the semiconductor substrate has a plurality of first openings to partially expose the first pads and second pads. The under bump metal layer is formed on the passivation layer and covers each of the first pads and each of the second pads through each of the first openings formed in the passivation layer to electrically connect with each of the first pads and each of the second pads. The method for forming a conductive structure comprises the steps:

(a) forming a patterned insulation layer on the under bump metal layer with the patterned insulation layer being formed with a plurality of second openings to partially expose the under bump metal layer, wherein each of the second openings has a first opening-width in the first area and a second opening-width in either the second or third area; the first opening-width is smaller than the second opening-width;

(b) forming a conductive bump within each of the second openings to partially cover the under bump metal layer with the conductive bumps disposed on each of the first pads and each of the second pads, wherein a shape of each of the conductive bumps corresponds to a shape of each of the second openings in such a way that a first bump-width of the conductive bump corresponds to the first opening-width and a second bump-width of the conductive bump corresponds to the second opening-width; the first bump-width is smaller than the second bump-width; and (c) removing the patterned insulation layer to expose each of the conductive bumps.

The detailed technology and preferred embodiments implemented for the subject invention are described in the following paragraphs accompanying the appended drawings for people skilled in this field to well appreciate the features of the claimed invention.

BRIEF DESCRIPTION OF THE DRAWINGS

FIG. 1A' to FIG. 1C' are schematic side views of FIG. 1A to FIG. 1C;

FIGS. 2A' to 2E' are schematic side views corresponding to FIGS. 2A to 2E;

DESCRIPTION OF THE PREFERRED EMBODIMENT

In the following descriptions, the present invention will be explained with reference to embodiments thereof. However, the description of these embodiments is only for purpose of elucidating the technical contents and objectives of the present invention rather than to limit the present invention. It shall be appreciated that in the following embodiments and the attached drawings, elements not directly related to the present invention are omitted from depiction; and dimensional and positional relationships among individual elements in the attached drawings are illustrated only for ease of understanding but not to limit the actual scale and dimensions.

FIGS. 2A to 2E and FIGS. 2A' to 2E' are schematic views illustrating a conductive structure 3 for a semiconductor chip 2 and a process of forming the conductive structure 3 according to the first embodiment the present invention. Specifically, FIGS. 2A to 2E are schematic top views of the conductive structure 3; and FIGS. 2A' to 2E' are schematic side views corresponding to FIGS. 2A to 2E respectively. The following description will be made according to the production sequence of the semiconductor chip 2 and the conductive structure 3 and with reference to the attached drawings.

Figure 2A:
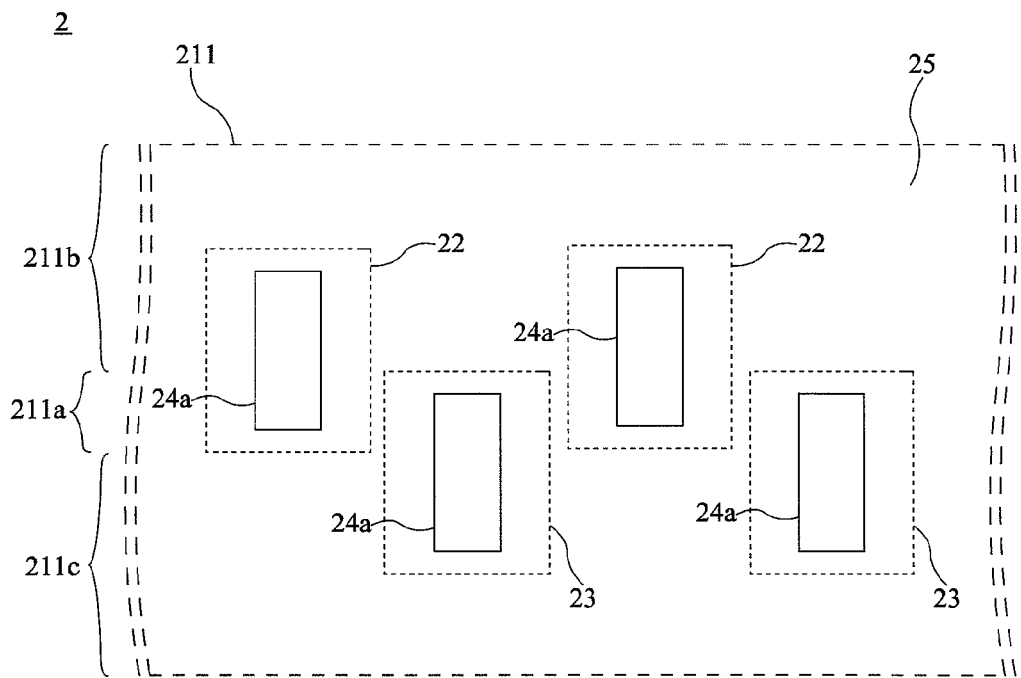
FIG. 2A to FIG. 2E are schematic and partial top views illustrating a conductive structure and a process of forming the conductive structure according to the first embodiment of the present invention.
Figure 2A:
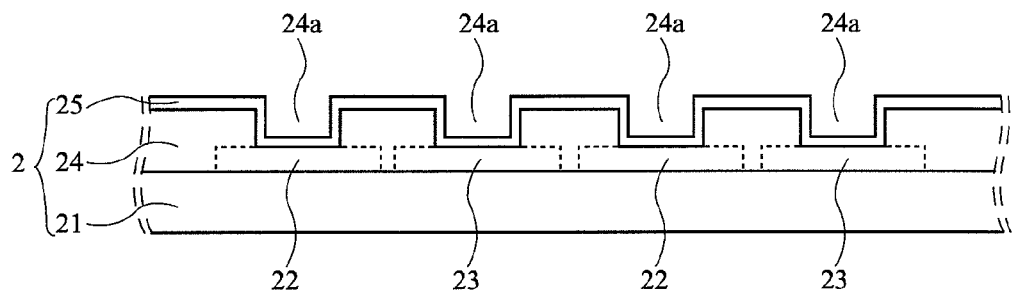

First, as shown in FIG. 2A', the semiconductor chip 2 of this embodiment comprises a semiconductor substrate 21, a plurality of first pads 22, a plurality of second pads 23, a passivation layer 24 and an under bump metal layer 25. As shown in FIG. 2A, the semiconductor substrate 21 has a pad area 211. The pad area 211 is further divided into a first area 211a, a second area 211b and a third area 211c, wherein the first area 211a is located between the second area 211b and the third area 211c. Each of the first pads 22 and each of the second pads 23 are alternately arranged on the pad area 211 of the semiconductor substrate 21. The first pads 22 and the second pads 23 of this embodiment are arranged in a different way from the conventional pads 12 in that only a part of each of the first pads 22 and a part of each of the second pads 23 are interlaced with each other in the first area 211a; and each of the first pads 22 extends towards the second area 211b while each of the second pads 23 extends toward the third area 211c.

It shall be appreciated that in other embodiments of the present invention, the extending directions of each of the first pads 22 and each of the second pads 23 are not limited to what has been described above and shown in FIG. 2A; and instead, it is also possible that each of the first pads 22 and each of the second pads 23 which are interlaced with each other in the first area 211 can be changed to extend towards the third area 211c and the second area 211b respectively.

Still, with reference to FIGS. 2A and 2A', the passivation layer 24 is formed on the semiconductor substrate 21, and has a plurality of first openings 24a to partially expose the first pads 22 and the second pads 23; and then, the under bump metal layer 25 is formed on the passivation layer 24 and electrically connects with the first pads 22 and the second pads 23 through the first openings 24a formed in the passivation layer 24.

Figure 2B:
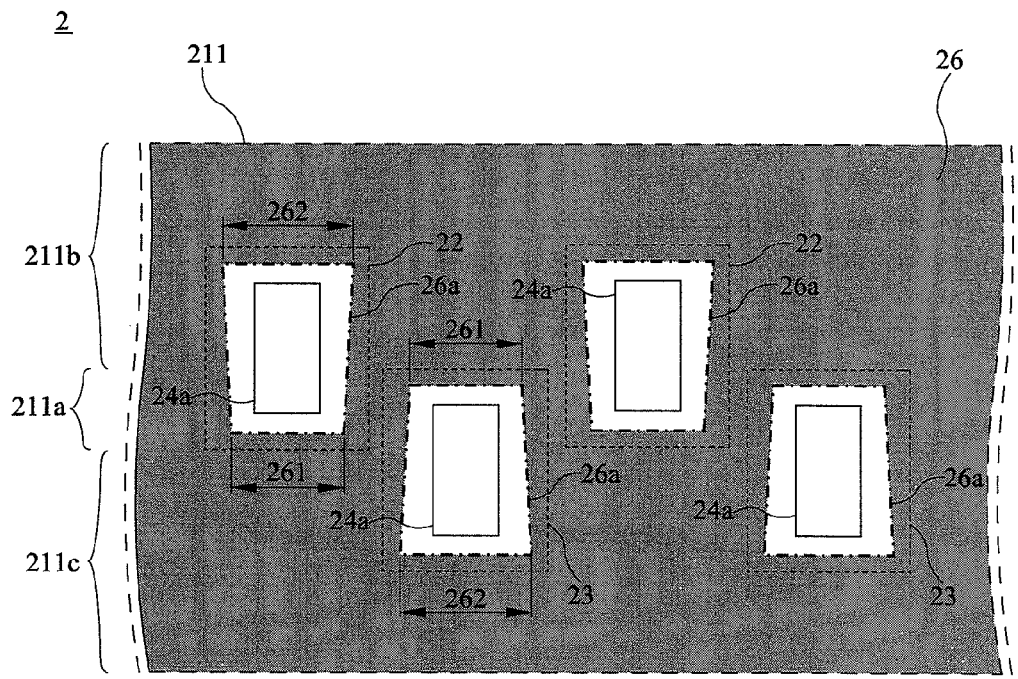
Figure 2B:
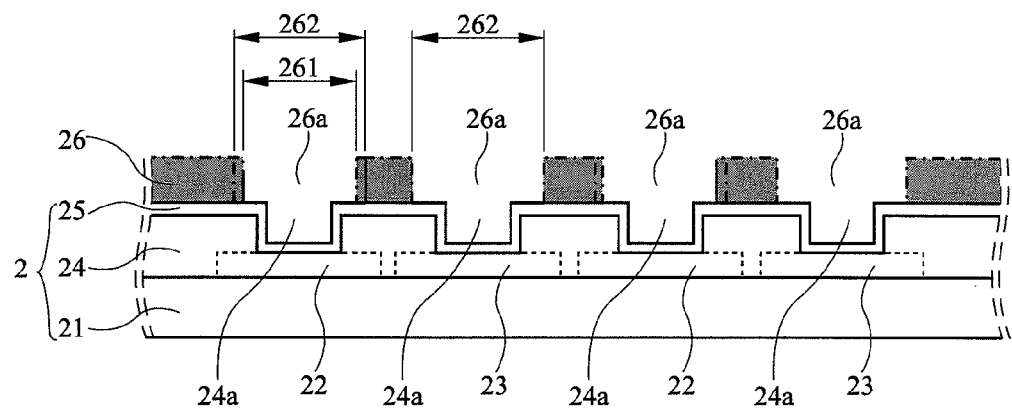
Figure 4:
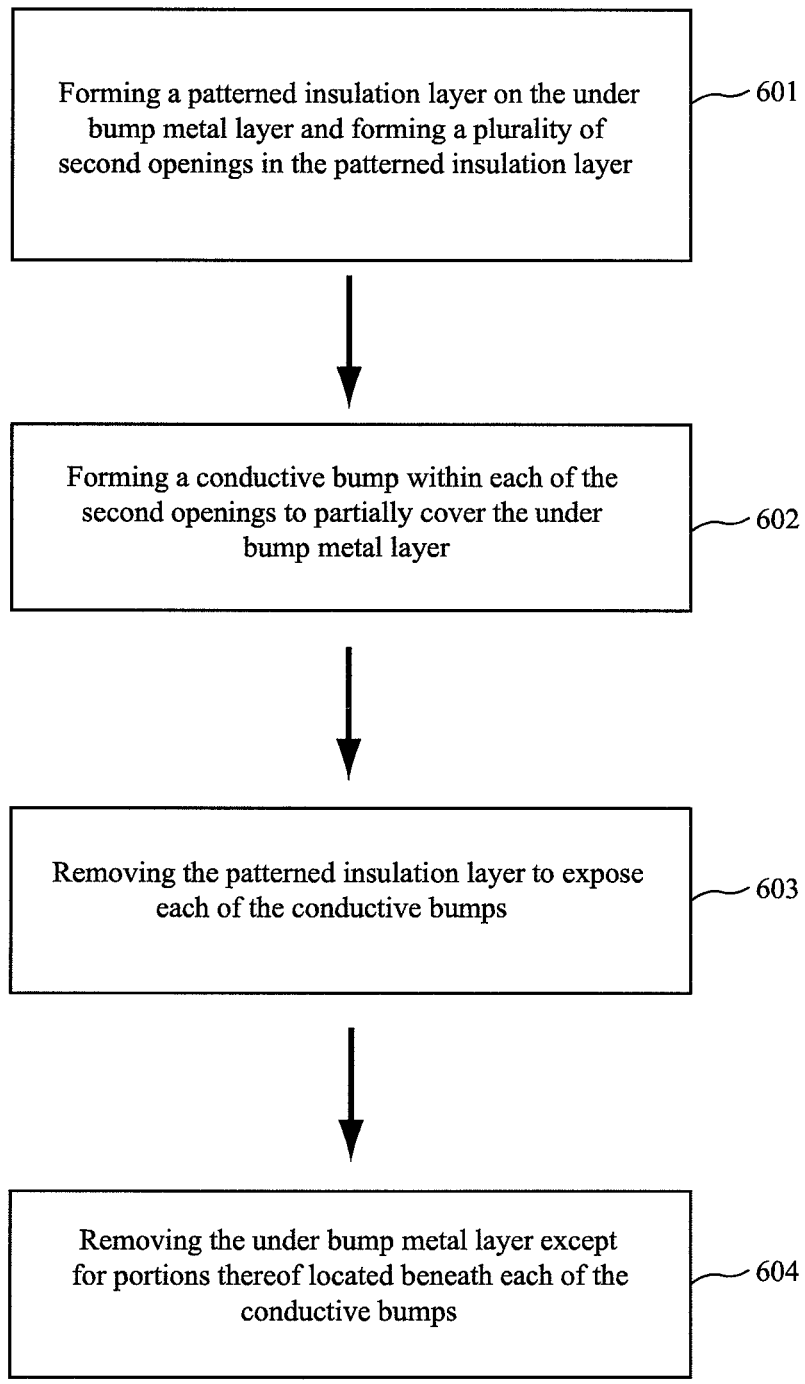
FIG. 4 is a schematic flowchart diagram of a method for forming the conductive structure according to the first embodiment of the present invention.

To form the conductive structure 3 of this embodiment, the method for forming the conductive structure 3 as shown in FIG. 4 (with reference to both FIGS. 2B and 2B') comprises a step 601 of forming a patterned insulation layer 26 on the under bump metal layer 25 and forming a plurality of second openings 26a in the patterned insulation layer 26 to partially expose the under bump metal layer 25. As shown in FIG. 2B, each of the second openings 26a of the patterned insulation layer 26 has a first opening-width 261 in the first area 211a and a second opening-width 262 which is opposite to the first opening-width 261 and located in either the second area 211b or the third area 211c; and the first opening-width 261 is smaller than the second opening-width 262. Furthermore, in this embodiment, each of the second openings 26a is larger than each of the first openings 24a.

One of the features of the method for forming the conductive structure of the present invention is that the present invention can form openings of special shapes in the patterned insulation layer through a photolithography process or an etching process. In detail, with reference to FIG. 2B, through the photolithography process, this embodiment makes the first opening-width 261 of each of the second openings 26a smaller than the second opening-width 262 and makes each of the second openings 26a in the trapezoidal form on the whole. Moreover, the second openings 26a are interlaced with each other and extend toward the second area 211b and the third area 211c respectively. Thereby, the patterned insulation layer 26 between the second openings 26a of this embodiment has sufficient thickness and strength to avoid collapse, and this is favorable for forming conductive bumps 31 of the conductive structure 3 subsequently.

In this embodiment, the patterned insulation layer 26 is preferably made of Polyimide (PI), a Solder Resist (SR), Benzocyclobutene (BCB), or a siloxane polymer (SINR). It shall be supplemented herein that the siloxane polymer used in this embodiment is the SINR series material manufactured by Shin-Etsu Chemical Co., Ltd. Furthermore, the first pads 22 and the second pads 23 are preferably made of Au, Cu, Al or other metals.

Figure 2C:
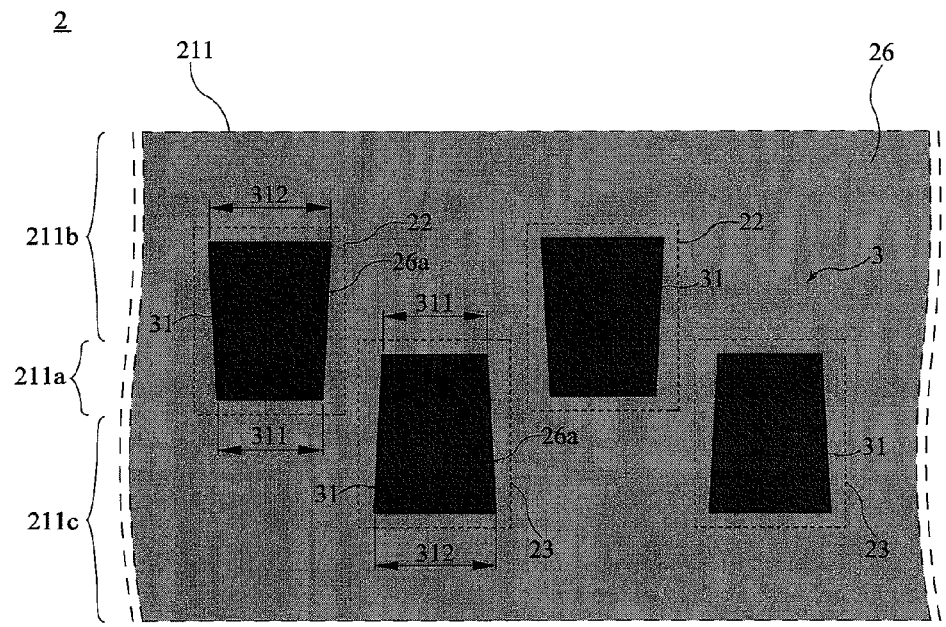
Figure 2C:
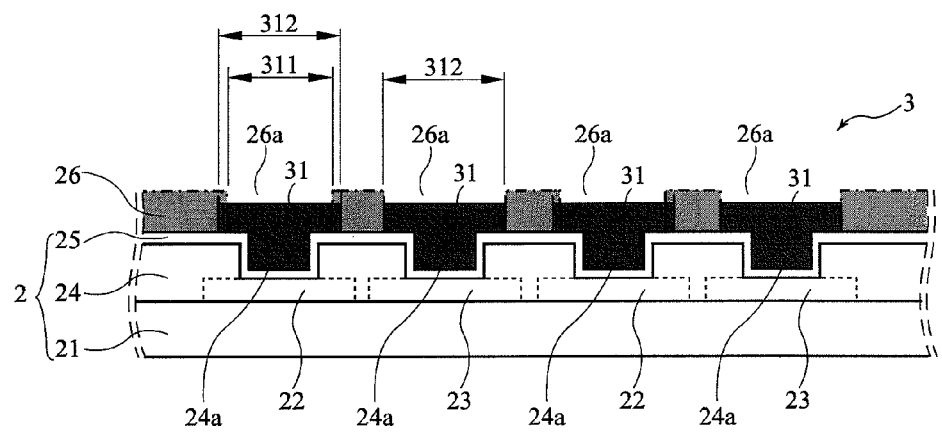

The following will reference FIGS. 2C, 2C' and 4. After step 601, step 602 is executed to form a conductive bump 31 within each of the second openings 26a. The conductive bumps 31 are located in each of the first openings 24a and each of the second openings 26a to partially cover the under bump metal layer 25, and are disposed above each of the first pads 22 and each of the second pads 23. Furthermore, a shape of each of the conductive bumps 31 also corresponds to a shape of each of the second openings 26a in such a way that the first bump-width 311 and second bump-width 312 of the conductive bump 31 correspond to the first opening-width 261 and the second opening-width 262 respectively. The first bump-width 311 is smaller than the second bump-width 312. Because the conductive bumps 31 are formed on the under bump metal layer 25, each of the conductive bumps 31 can electrically connect with each of the first pads 22 and each of the second pads 23 through the under bump metal layer 25.

In this embodiment, the conductive bumps 31 are preferably formed through an electroplating process, and the conductive bumps 31 may be made of a material selected from Au, Cu, Ag, Ni, and alloys thereof. Alternatively, in other embodiments of the present invention, the conductive bumps may be formed through printing, and may be made of Ag.

The conductive bumps 31 as a whole are covered by the patterned insulation layer at the current stage. Therefore, as shown in FIG. 2D, FIG. 2D' and FIG. 4, after step 602, step 603 is executed to remove the patterned insulation layer 26 to expose each of the conductive bumps 31 and the under bump metal layer 25.

To explain the advantages of the conductive structure 3 of the present invention more clearly, the following description will be made with reference to FIGS. 2D and 2D'. Step 604 is further executed after step 603 to remove the under bump metal layer 25 except the portions that are located beneath each of the conductive bumps 31, as shown in FIG. 3 to prevent electrical conduction between the substrate 21 and external components through the under bump metal layer 25. In this embodiment, the under bump metal layer 25, except for portions thereof that are located beneath the conductive bumps 31 (i.e., the under bump metal layer 25 located above the first area 211a, second area 211b and third area 211c) is removed by using an etchant through an etching process to expose the passivation layer 24 made of a nonconductive material.

Figure 1A:
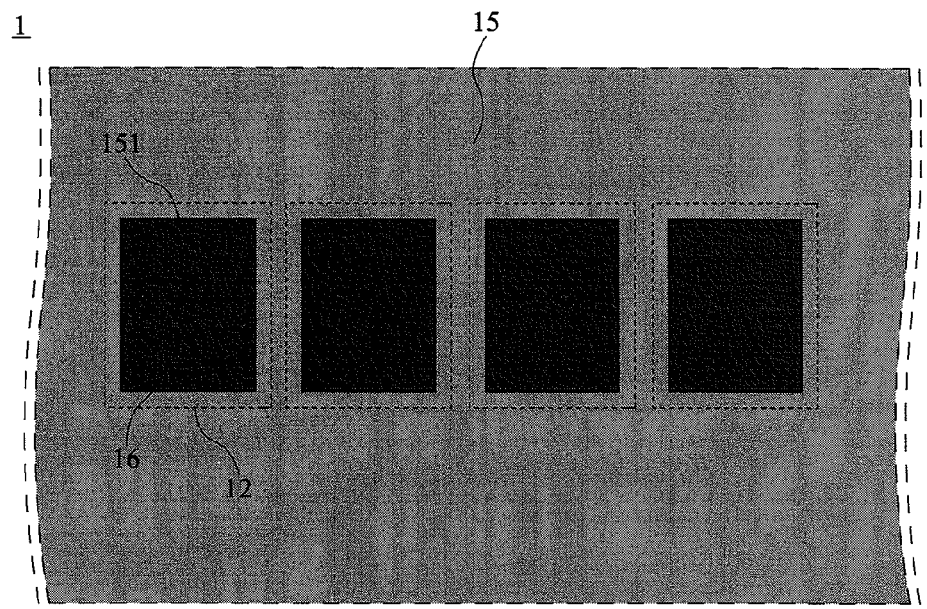
FIGS. 1A to 1C are schematic and partial top views illustrating a conductive structure and a process of forming the conductive structure of the prior art.
Figure 1A:
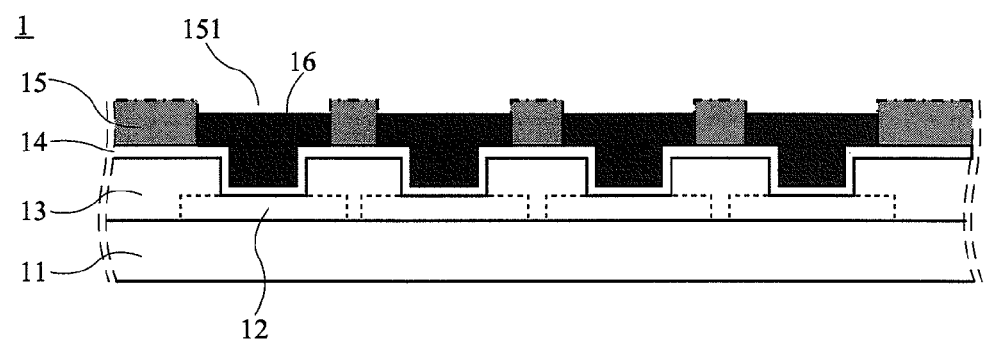
Figure 1B:
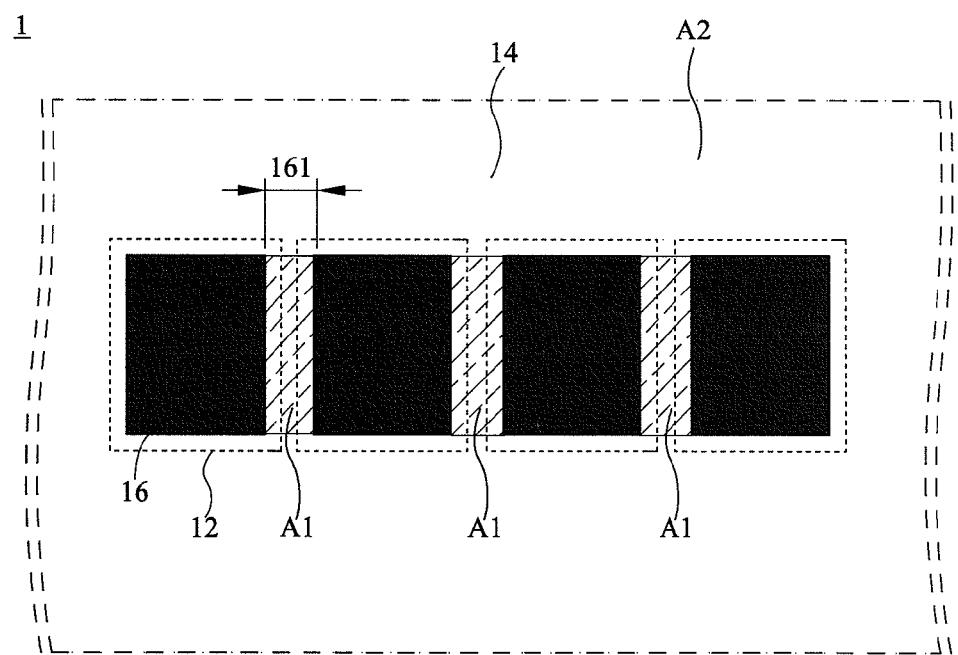
Figure 1B:
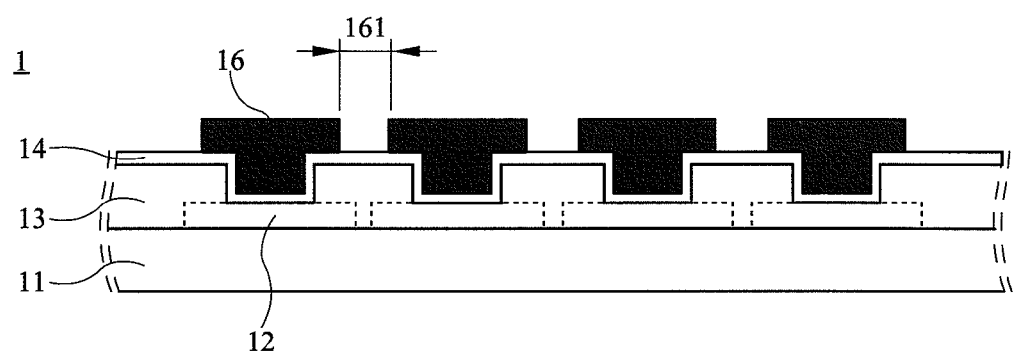
Figure 1C:
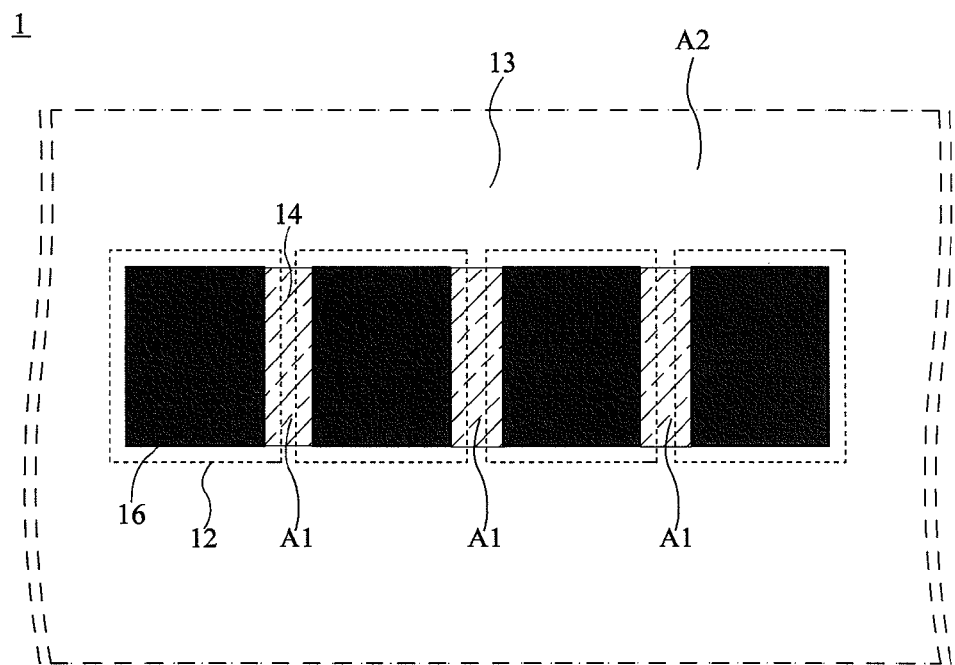
Figure 1C:
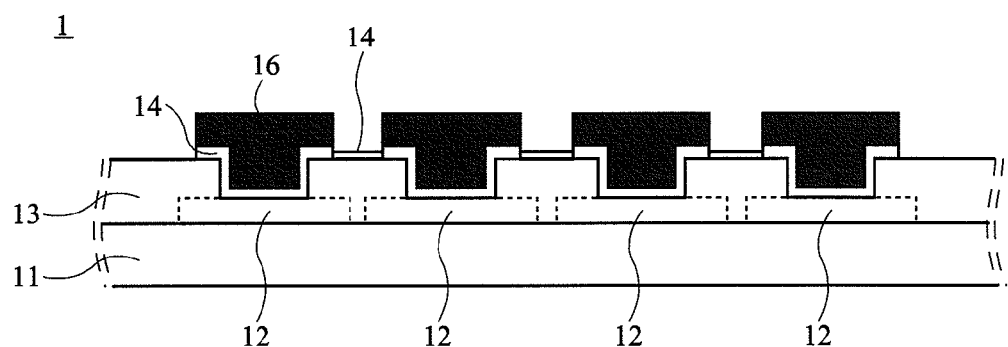
Figure 2D:
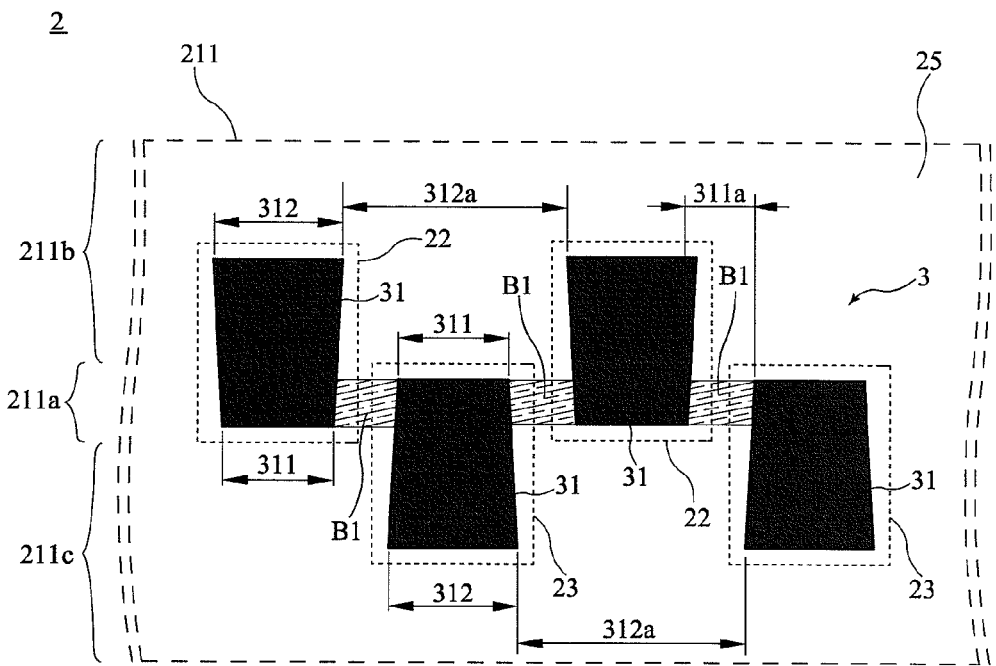
Figure 2D:
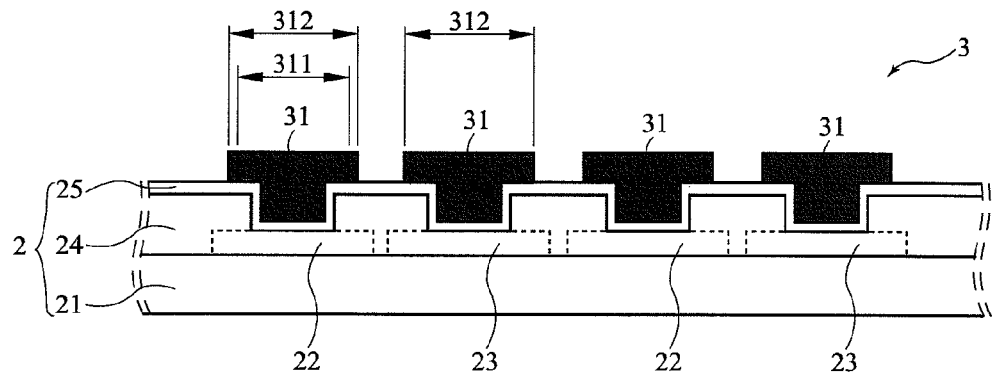

Expanding on the above, with reference to FIG. 2D, a first spacing distance 311a exists between the conductive bumps 31 in the first area 211a. As compared to the spacing distance 161 (as shown in FIGS. 1B and 1C) between the bumps 16 of the semiconductor structure 1 of the prior art, the spacing distance 311a between the conductive bumps 31 of this embodiment is significantly wider. Moreover, two adjacent and alternately arranged conductive bumps 31 of this embodiment are projected onto each other in the first area 211a to form a first overlapping area B1. As compared to the overlapping area A1 (as shown in FIGS. 1B and FIG. 1C) formed by two adjacent and alternately arranged bumps 16 of the semiconductor structure 1 of the prior art when being projected onto each other, the first overlapping area B1 of this embodiment is significantly reduced in area. Thereby, when the step 604 of the present invention is executed, the etchant can flow into each of the first overlapping areas B1 rapidly, and easily remove the part of the under bump metal layer 25 that is located above the first area 211a. The first spacing distance 311a between the conductive bumps 31 is preferred to be between 6 μm and 8 μm.

Figure 2E:
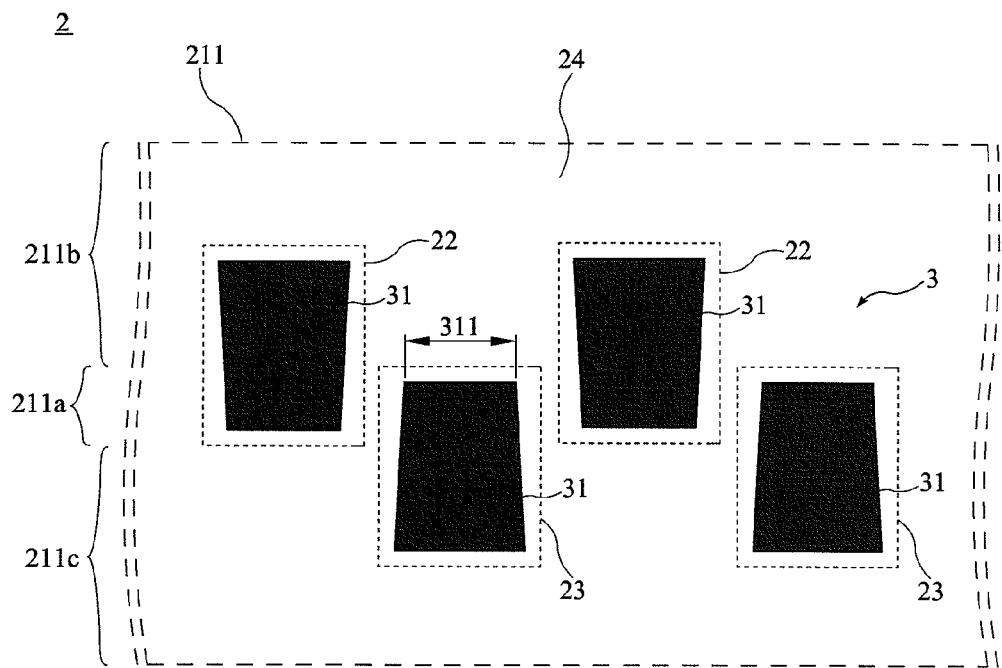
Figure 2E:
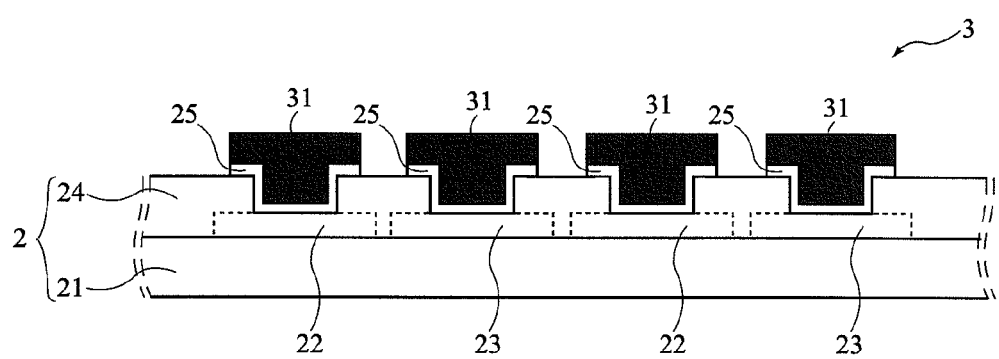

Finally, with reference to FIGS. 2E and 2E', there are schematic views of the conductive structure for a semiconductor chip according to the present invention. After step 604 is completed (i.e., after the under bump metal layer 25 is removed), the under bump metal layer 25 is only allowed to remain right below each of the conductive bumps 31 so that the conductive bumps 31 electrically connects with the first pads 22 and the second pads 23 through the under bump metal layer 25; that is, no unnecessary under bump metal layer 25 will remain in the first area 211a, second area 211b and third area 211c.

The shapes of the openings of the patterned insulation layer and the shapes of the conductive bumps according to the present invention are not limited to the trapezoidal form of the first embodiment. Now, descriptions will be further made on a conductive structure 5 for a semiconductor chip 4 according to the second embodiment of the present invention. The structure and the forming method of the second embodiment are the same as those of the first embodiment and, thus, will not be further described herein. However, the shapes of the second openings 46a of a patterned insulation layer 46 of the semiconductor chip 4 and shapes of conductive bumps 51 of the conductive structure 5 in the second embodiment are different from those in the first embodiment, so the following description only focuses on the shapes of the conductive bumps 51.

Figure 3A:
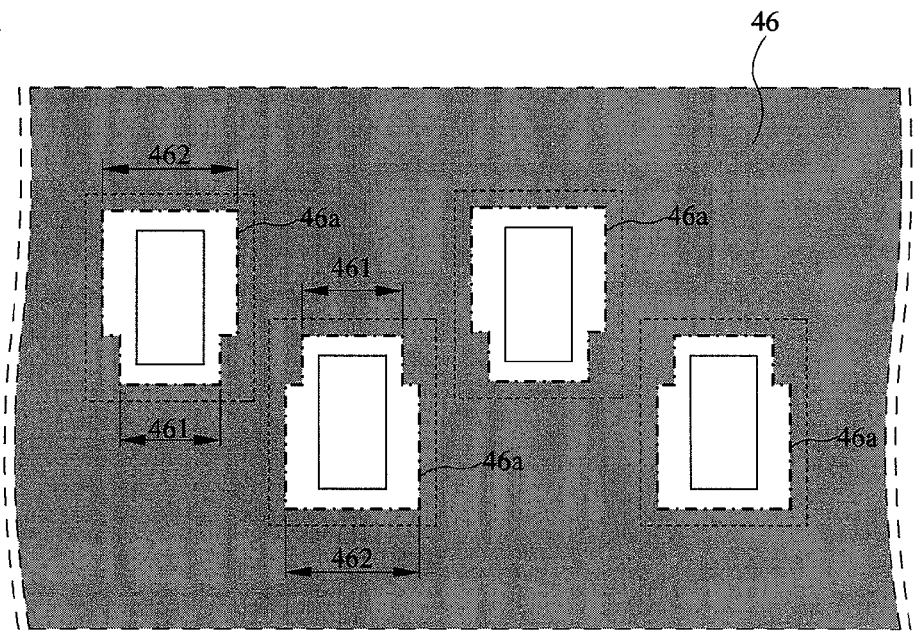
FIGS. 3A and 3B are schematic and partial top views illustrating another implementation of a conductive structure and a method for forming the conductive structure according to the present invention.
Figure 3B:
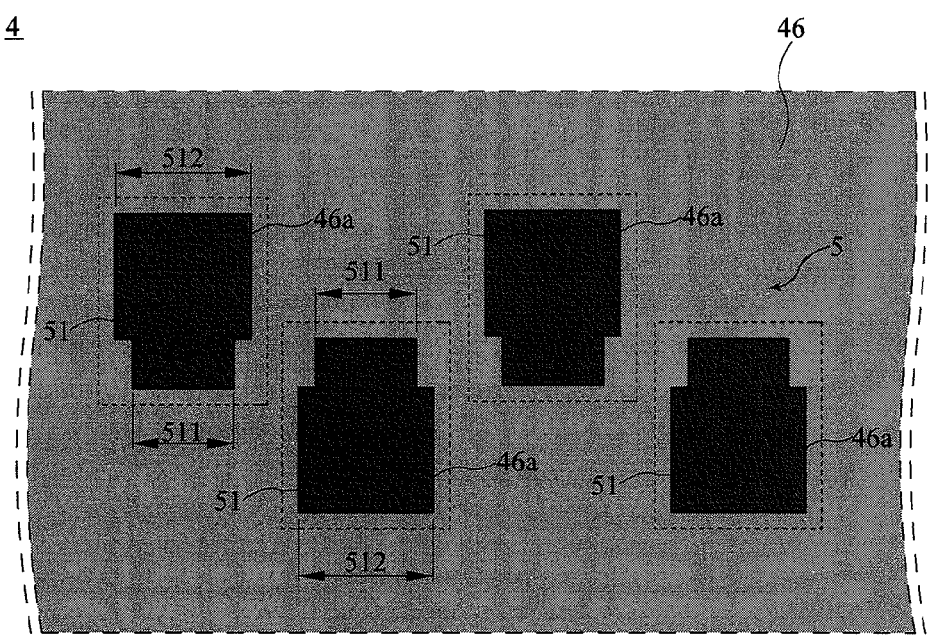

FIGS. 3A and 3B show schematic top views according to the second embodiment of the present invention. As shown in FIG. 3A, each of the second openings 46a formed in the patterned insulation layer 46 is in the "upside down T" form. Similar to the first embodiment, the first opening-width 461 of each of the second openings 46a is also smaller than the second opening-width 462, and each of the first opening-widths 461 is located in the first area of the semiconductor substrate. Likewise, the patterned insulation layer 46 between the second openings 46a also has sufficient thickness and strength to avoid collapse, and this is favorable for subsequently forming conductive bumps. Next, as shown in FIG. 3B, after the conductive bumps 51 of the conductive structure 5 are formed within the second openings 46a, each of the conductive bumps 51 also has a shape corresponding to a shape of each of the second openings 46a and has a first bump-width 511 and a second bump-width 512 opposite to the first bump-width 511. The first bump-width 511 is smaller than the second bump-width 512.

According to the above descriptions, the conductive structure for a semiconductor chip according to the present invention adopts conductive bumps with a unique contour and arrangement. Thereby, when the under bump metal layer is etched, the under bump metal layer between the conductive bumps can be removed rapidly and completely. Therefore, when unnecessary portions of the under bump metal layer are removed, the conductive bumps can be protected from being excessively etched by the etchant, thus, solving the problem of deformation of the conventional conductive bumps.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A conductive structure for a semiconductor chip, the semiconductor chip comprising a semiconductor substrate, a plurality of first pads, a plurality of second pads, a passivation layer and a plurality of under bump metal layers, wherein each of the first pads and each of the second pads are alternately arranged on a pad area of the semiconductor substrate, the pad area defines a first area, a second area and a third area, the first area is located between the second area and the third area, each of the first pads and each of the second pads are interlaced with each other on the first area, and the first area is extending toward the second area and the third area respectively, and wherein the passivation layer formed on the semiconductor substrate has a plurality of first openings to partially expose each of the first pads and each of the second pads, and each of the under bump metal layers is formed on the passivation layer and is electrically connected with each of the first pads and each of the second pads through each of the first openings formed in the passivation layer, the conductive structure comprising:

a plurality of conductive bumps, formed on each of the first pads and each of the second pads respectively, each of the under bump metal layers being disposed under each of the conductive bumps so that each of the conductive bumps is electrically connected with each of the first pads and each of the second pads through each of the under bump metal layers, wherein each of the conductive bumps has a first bump-width in the first area and a second bump-width in one of the second area and the third area, and the first bump-width is smaller than the second bump-width.

2. The conductive structure as claimed in claim 1, wherein each of the conductive bumps is formed within each of the first openings to cover each of the first pads and each of the second pads and partially overlaps the passivation layer.

3. The conductive structure as claimed in claim 2, wherein each of the conductive bumps is made of a material selected from a group consisting of Au, Cu, Ag, Ni, and alloys thereof.

4. The conductive structure as claimed in claim 3, wherein a spacing distance between adjacent ones of the conductive bumps on the first area is between 6 μm and 8 μm.

5. The conductive structure as claimed in claim 4, wherein each of the conductive bumps is made by an electroplating process.

6. A method for forming a conductive structure of a semiconductor chip, the semiconductor chip comprising a semiconductor substrate, a plurality of first pads, a plurality of second pads, a passivation layer and an under bump metal layer, wherein each of the first pads and each of the second pads are alternately arranged on a pad area of the semiconductor substrate, the pad area defines a first area, a second area and a third area, the first area is located between the second area and the third area, each of the first pads and each of the second pads are interlaced with each other on the first area, and the first area is extending toward the second area and the third area respectively, and wherein the passivation layer formed on the semiconductor substrate has a plurality of first openings to partially expose the first pads and the second pads, and the under bump metal layer is formed on the passivation layer and covers each of the first pads and each of the second pads through each of the first openings formed in the passivation layer to electrically connect with each of the first pads and each of the second pads, the method comprising the steps of:

(a) forming a patterned insulation layer on the under bump metal layer, the patterned insulation layer being formed with a plurality of second openings to partially expose the under bump metal layer, wherein each of the second openings has a first opening-width in the first area and a second opening-width in one of the second area and the third area, and the first opening-width is smaller than the second opening-width;

(b) forming a conductive bump within each of the second openings to partially cover the under bump metal layer, the conductive bumps being disposed on each of the first pads and each of the second pads, wherein a shape of each of the conductive bumps corresponds to a shape of each of the second openings in such a way that a first bump-width of the conductive bump corresponds to the first opening-width and a second bump-width of the conductive bump corresponds to the second opening-width, and the first bump-width is smaller than the second bump-width; and (c) removing the patterned insulation layer to expose each of the conductive bumps.

7. The method as claimed in claim 6, further comprising a step (d) of removing the under bump metal layer located outside each of the conductive bumps after the step (c).

8. The method as claimed in claim 7, wherein in the step (d), the under bump metal layer is removed through an etching process in which an etching rate in the first area is lower than an etching rate in the second area and the third area.

9. The method as claimed in claim 8, wherein the patterned insulation layer is made of Polyimide, a Solder Resist, Benzocyclobutene, or a Siloxane Polymer.

10. The method as claimed in claim 9, wherein each of the conductive bumps is made of a material selected from a group consisting of Au, Cu, Ag, Ni, and alloys thereof.

11. The method as claimed in claim 10, wherein each of the conductive bumps is made by an electroplating process.

* * * * *